(12) United States Patent
Ito (10) Patent No.: US 6,512,281 B2
(45) Date of Patent: Jan. 28, 2003

(54) METHOD OF FORMING A SEMICONDUCTOR DEVICE AND AN IMPROVED DEPOSITION SYSTEM

(75) Inventor: Nobukazu Ito, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/919,389

(22) Filed: Jul. 31, 2001

(65) Prior Publication Data

US 2001/0040264 A1 Nov. 15, 2001

Related U.S. Application Data

(62) Division of application No. 09/288,265, filed on Apr. 8, 1999, now Pat. No. 6,372,114.

(30) Foreign Application Priority Data

Apr. 8, 1998 (JP) .............................................. 10-96502

(51) Int. Cl.[7] ............................................ H01L 27/095
(52) U.S. Cl. ...................... 257/486; 257/508; 257/520; 257/602; 257/621; 257/758
(58) Field of Search ................................ 257/486, 508, 257/520, 602, 621, 758, 753, 752, 774, 762

(56) References Cited

U.S. PATENT DOCUMENTS

| | | | | |
|---|---|---|---|---|
| 5,968,333 A | * | 10/1999 | Nogami et al. | ............. 205/184 |
| 5,969,422 A | * | 10/1999 | Ting et al. | ................... 257/762 |
| 6,022,808 A | * | 2/2000 | Nogami et al. | ............. 438/694 |
| 6,249,055 B1 | * | 6/2001 | Dubin | ......................... 257/758 |

FOREIGN PATENT DOCUMENTS

JP  08264538 A  * 10/1996

* cited by examiner

*Primary Examiner*—Nathan J. Flynn
*Assistant Examiner*—Remmon R. Fordé
(74) *Attorney, Agent, or Firm*—Hayes Soloway, PC (57) ABSTRACT

A method of forming a multi-layer structure over an insulating layer comprises the steps of: selectively depositing a barrier layer on a predetermined region of an insulating layer by use of a first deposition mask; selectively depositing a metal seed layer made of a metal which is different in substance from the barrier layer by use of a second deposition mask, so that the metal seed layer extends not only on an entire surface of the barrier layer but also a peripheral region positioned outside the predetermined region of the insulating layer; and forming a metal plating layer made of the same metal as the seed layer, so that the metal plating layer is adhered on the metal seed layer whereby the metal plating layer is separated from the barrier layer and also from the insulating layer.

6 Claims, 7 Drawing Sheets

METHOD OF FORMING A SEMICONDUCTOR DEVICE AND AN IMPROVED DEPOSITION SYSTEM

This is a division of application Ser. No. 09/288,265, filed Apr. 8, 1999 now U.S. Pat. No. 6,372,114.

BACKGROUND OF THE INVENTION

The present invention relates to a method of forming a copper electrode buried in an insulating layer of a semiconductor device free from such a problem that a copper electrode plating layer is peeled thereby educing a yield of a semiconductor device, and more particularly to a method of forming a copper electrode on a copper seed layer on a TiN barrier layer formed in a trench groove and a through hole formed in an inter-layer insulator of a semiconductor device, buried in an insulating layer of a semiconductor device.

SUMMARY OF THE INVENTION

Accordingly, it is an object of the present invention to provide a novel a method of forming a copper electrode buried in an insulating layer of a semiconductor device free from such a problem that a copper electrode plating layer is peeled thereby educing a yield of a semiconductor device.

It is another object of the present invention to provide a method of forming a copper electrode on a copper seed layer on a TiN barrier layer formed in a trench groove and a through hole formed in an inter-layer insulator of a semiconductor device, buried in an insulating layer of a semiconductor device.

The first present invention provides a multi-layer structure comprising: a barrier layer on a predetermined region of an insulating layer; a metal seed layer made of a metal which is different in substance from the barrier layer, the metal seed layer extending not only on an entire surface of the barrier layer but also a peripheral region positioned outside the predetermined region of the insulating layer; and a metal plating layer made of the metal as the seed layer, and the metal layer being adhered on the metal seed layer so that the metal plating layer is separated from the barrier layer and also from the insulating layer.

The second present invention provides a method of forming a multi-layer structure over an insulating layer. The method comprises the steps of: selectively depositing a barrier layer on a predetermined region of an insulating layer by use of a first deposition mask; selectively depositing a metal seed layer made of a metal which is different in substance from the barrier layer by use of a second deposition mask, so that the metal seed layer extends not only on an entire surface of the barrier layer but also a peripheral region positioned outside the predetermined region of the insulating layer; and forming a metal plating layer made of the same metal as the seed layer, so that the metal plating layer is adhered on the metal seed layer whereby the metal plating layer is separated from the barrier layer and also from the insulating layer.

The third present invention provides a deposition system for forming a multi-layer structure over an insulating layer. The deposition system comprises: a first deposition chamber having a first deposition mask for selectively depositing a barrier layer on a predetermined region of an insulating layer; and a second deposition chamber having a second deposition mask for selectively depositing a metal seed layer made of a metal which is different in substance from the barrier layer, so that the metal seed layer extends not only on an entire surface of the barrier layer but also a peripheral region positioned outside the predetermined region of the insulating layer, wherein the first deposition mask has a first opening edge having a first diameter and the second mask has a second opening edge having a second diameter which is larger than the first diameter of the first deposition mask, whereby a metal plating layer made of the metal as the seed layer is formed on the metal seed layer, wherein the metal plating layer is separated from the barrier layer and also from the insulating layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a multi-layer structure comprising: a barrier layer on a predetermined region of an insulating layer; a metal seed layer made of a metal which is different in substance from the barrier layer, the metal seed layer extending not only on an entire surface of the barrier layer but also a peripheral region positioned outside the predetermined region of the insulating layer; and a metal plating layer made of the metal as the seed layer, and the metal layer being adhered on the metal seed layer so that the metal plating layer is separated from the barrier layer and also from the insulating layer.

It is preferable that the barrier layer comprises a TiN barrier layer, and the metal seed layer and the metal plating layer are made of copper.

It is also preferable that the multi-layer structure is formed in at least one of a trench groove in an inter-layer insulator as the insulating layer and a through hole also formed in the inter-layer insulator.

The second present invention provides a method of forming a multi-layer structure over an insulating layer. The method comprises the steps of: selectively depositing a barrier layer on a predetermined region of an insulating layer by use of a first deposition mask; selectively depositing a metal seed layer made of a metal which is different in substance from the barrier layer by use of a second deposition mask, so that the metal seed layer extends not only on an entire surface of the barrier layer but also a peripheral region positioned outside the predetermined region of the insulating layer; and forming a metal plating layer made of the same metal as the seed layer, so that the metal plating layer is adhered on the metal seed layer whereby the metal plating layer is separated from the barrier layer and also from the insulating layer.

It is preferable that the first deposition mask has a first opening edge having a first diameter and the second mask has a second opening edge having a second diameter which is larger than the first diameter of the first deposition mask.

It is also preferable that the first deposition mask comprises a first clamping ring member with the first opening edge having the first diameter of a first damper for clamping a wafer for a deposition process for selectively depositing the barrier layer on the predetermined region of the insulating layer, and the second deposition mask comprises a second clamping ring member with the second opening edge having the second diameter of a second damper for clamping the wafer for a deposition process for selectively depositing the metal seed layer not only on an entire surface of the barrier layer but also the peripheral region positioned outside the predetermined region of the insulating layer.

It is also preferable that the first deposition mask comprises a first shielding plate extension member extending from a first shielding plate covering an inner wall of a first chamber, and the first shielding plate extension member having the first opening edge having the first diameter for selectively depositing the barrier layer on the predetermined region of the insulating layer, and the second deposition mask comprises a second shielding plate extension member extending from a second shielding plate covering an inner wall of a second chamber, and the second shielding plate extension member having the second opening edge having the second diameter for selectively depositing the metal seed layer not only on an entire surface of the barrier layer but also the peripheral region positioned outside the predetermined region of the insulating layer.

It is also preferable that the barrier layer comprises a TiN barrier layer, and the metal seed layer and the metal plating layer are made of copper.

It is also preferable that the multi-layer structure is formed in at least one of a trench groove in an inter-layer insulator as the insulating layer and a through hole also formed in the inter-layer insulator.

The third present invention provides a deposition system for forming a multi-layer structure over an insulating layer. The deposition system comprises: a first deposition chamber having a first deposition mask for selectively depositing a barrier layer on a predetermined region of an insulating layer; and a second deposition chamber having a second deposition mask for selectively depositing a metal seed layer made of a metal which is different in substance from the barrier layer, so that the metal seed layer extends not only on an entire surface of the barrier layer but also a peripheral region positioned outside the predetermined region of the insulating layer, wherein the first deposition mask has a first opening edge having a first diameter and the second mask has a second opening edge having a second diameter which is larger than the first diameter of the first deposition mask, whereby a metal plating layer made of the metal as the seed layer is formed on the metal seed layer, wherein the metal plating layer is separated from the barrier layer and also from the insulating layer.

It is preferable that the first deposition mask comprises a first clamping ring member with the first opening edge having the first diameter of a first damper for clamping a wafer for a deposition process for selectively depositing the barrier layer on the predetermined region of the insulating layer, and the second deposition mask comprises a second clamping ring member with the second opening edge having the second diameter of a second damper for clamping the wafer for a deposition process for selectively depositing the metal seed layer not only on an entire surface of the barrier layer but also the peripheral region positioned outside the predetermined region of the insulating layer.

It is preferable that the first deposition mask comprises a first shielding plate extension member extending from a first shielding plate covering an inner wall of the first deposition chamber, and the first shielding plate extension member having the first opening edge having the first diameter for selectively depositing the barrier layer on the predetermined region of the insulating layer, and the second deposition mask comprises a second shielding plate extension member extending from a second shielding plate covering an inner wall of a second deposition chamber, and the second shielding plate extension member having the second opening edge having the second diameter for selectively depositing the metal seed layer not only on an entire surface of the barrier layer but also the peripheral region positioned outside the predetermined region of the insulating layer.

It is preferable that the barrier layer comprises a TiN barrier layer, and the metal seed layer is made of copper.

A first embodiment according to the present invention will be described in detail with reference to FIGS. 1A through 1E which are fragmentary cross sectional elevation views illustrative of semiconductor devices in sequential steps involved in a novel fabrication method thereof.

Figure 1A:
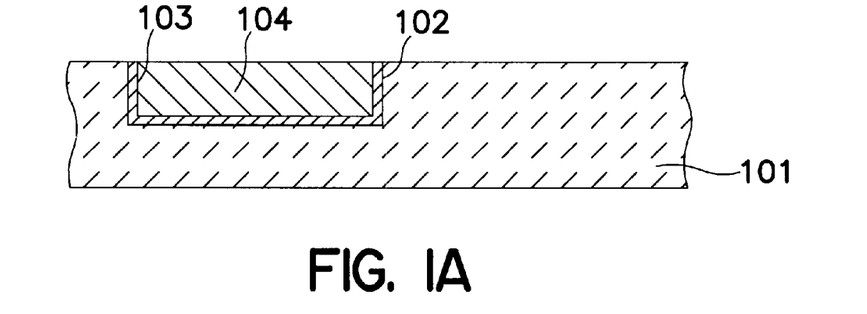
FIGS. 1A through 1E are fragmentary cross sectional elevation views illustrative of semiconductor devices in sequential steps involved in a novel fabrication method thereof by use of a novel deposition system in accordance with the present invention.

With reference to FIG. 1A, a first trench groove 102 is formed in an upper region of a first inter-layer insulator 101 which is formed over a silicon wafer which is not illustrated. A first barrier metal layer 103 is entirely deposited over the first inter-layer insulator 101 and on side walls and a bottom of the first trench groove 102. The first barrier metal layer 103 may comprise a titanium nitride or titanium. A first level interconnection layer 104 of tungsten is further deposited on the first barrier metal layer 104. Those first barrier metal layer 103 and the first level interconnection layer 104 are then subjected to a chemical mechanical polishing method to leave the first barrier metal layer 103 and the first level interconnection layer 104 only within the interconnection trench groove 102.

Figure 1B:
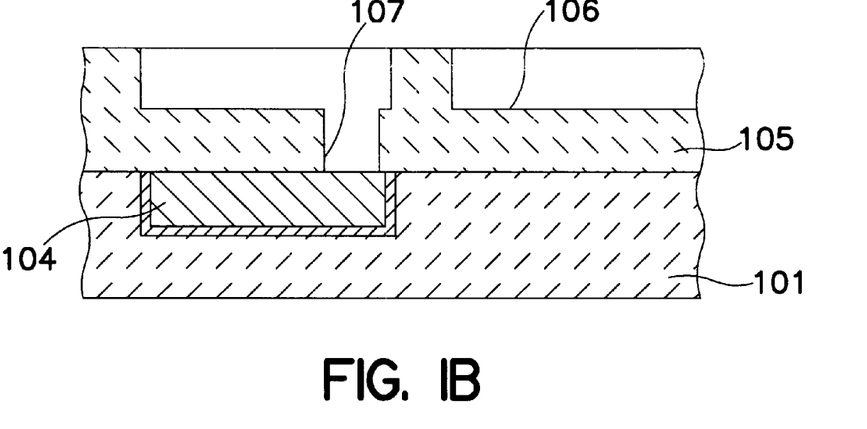

With reference to FIG. 1B, a second inter-layer insulator 105 is formed on the surface of the first inter-layer insulator 101 and on the first level interconnection layer 104. Second trench grooves 106 are formed in upper regions of the second inter-layer insulator 105. A through hole 107 is then formed in the second inter-layer insulator 105, so that the through hole 107 connects the bottom of the second trench groove and the top surface of the first level interconnection layer 104, whereby a part of the top surface of the first level interconnection layer 104 is shown through the through hole 107.

Figure 1C:
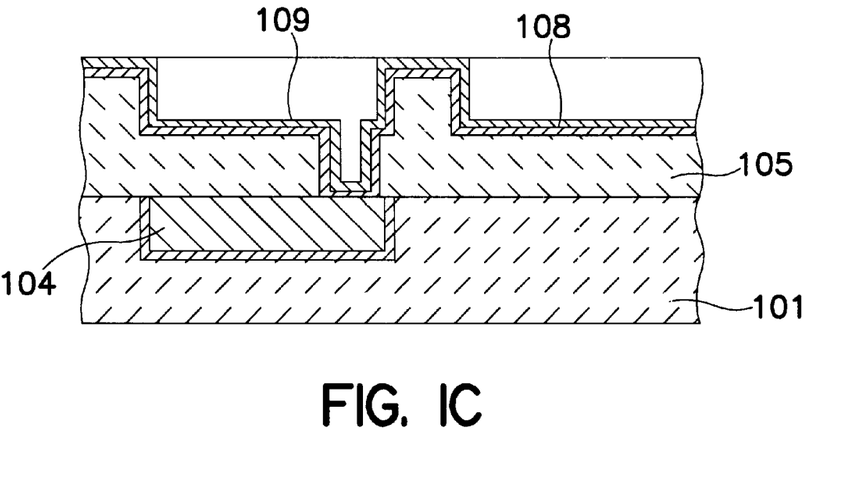

With reference to FIG. 1C, a second barrier metal layer 108 of titanium nitride is entirely deposited by a sputtering method on a top surface of the second inter-layer insulator 105 and side walls and bottoms of the second trench grooves 106 and on side walls of the through hole 107 as well as on the shown part of the top surface of the first level interconnection layer 104. A copper seed layer 109 is then deposited on the second barrier metal layer 108 by a sputtering method.

Figure 1D:
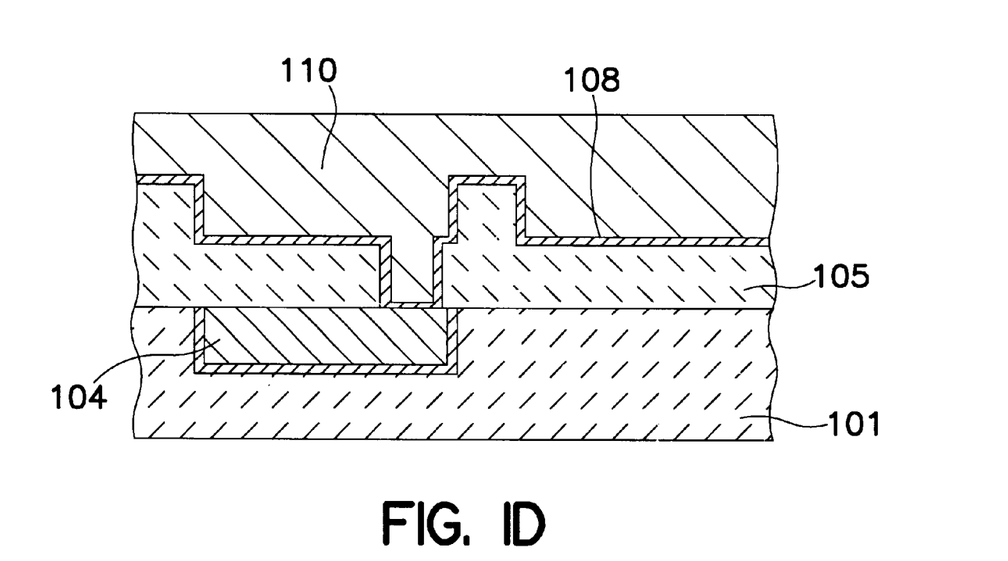

With reference to FIG. 1D, a copper plating layer 110 is then formed on the copper seed layer 109, so that the copper plating layer 110 is much thicker than the second trench grooves 106 and the through hole 107, whereby the top surface of the copper seed layer 109 over the top surface of the second inter-layer insulator 105 is completely embedded within the copper plating layer 110.

Figure 1E:
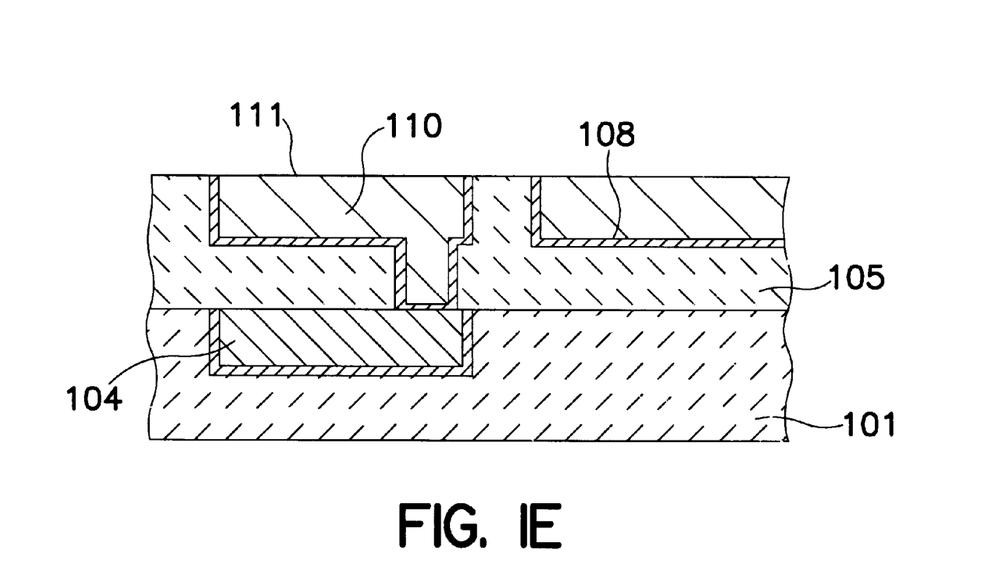

With reference to FIG. 1E, the copper plating layer 110 is then polished by a chemical mechanical polishing method so as to leave the copper plating layer 110 only within the second trench grooves 106 and the through hole 107 thereby forming copper electrodes as second level interconnection layers 111 within the second trench grooves 106 and the through hole 107.

Figure 2:
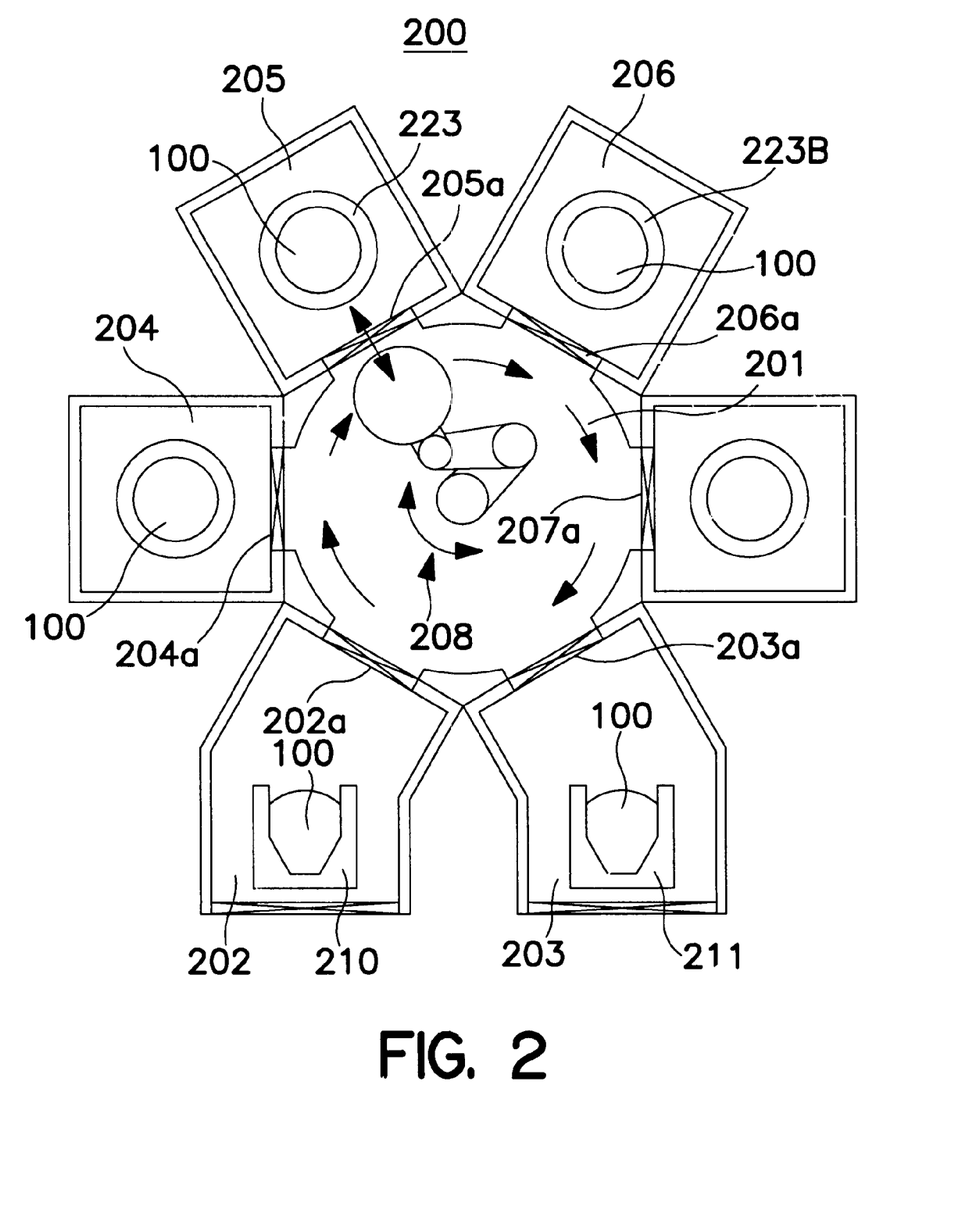
FIG. 2 is a plane view of a plane layout of a deposition system for depositing a barrier metal layer, a copper seed layer and a copper plating layer in accordance with the present invention.

FIG. 2 is a plane view of a plane layout of a deposition system for depositing a barrier metal layer, a copper seed layer and a copper plating layer. The above fabrication processes of FIGS. 1C and 1D are carried out by use of this deposition system 200. The deposition system 200 has a hexagonal shaped carrier chamber 201, and first and second load lock chambers 202 and 203 and four vacuum chambers 204, 205, 206 and 207. The first load lock chamber 202 serves as a loading chamber for setting a wafer 100 in a cartridge 210 accommodated in the first load lock chamber 202. The second load lock chamber 203 also serves as an unloading chamber for setting the wafer 100 in another cartridge 211 accommodated in the first load lock chamber 203. The first vacuum chamber 204 serves as a cleaning chamber. The second vacuum chamber 205 serves as a TiN barrier chamber. The third vacuum chamber 206 serves as a copper seed chamber. The fourth vacuum chamber 207 serves as a reserve chamber. The carrier chamber 201 is positioned in center of the deposition system. The two load lock chambers 202 and 203 and the four vacuum chambers 204, 205, 206 and 207 are positioned along six sides of the hexagonal shaped carrier chamber 201. The carrier chamber 201 has a handler 208 for carrying the wafer in a clock wise direction. The two load lock chambers 202 and 203 and the four vacuum chambers 204, 205, 206 and 207 are connected through gates 202a, 203a, 204a, 205a, 206a, 206a, and 207a to the carrier chamber 201 so that the two load lock chambers 202 and 203 and the four vacuum chambers 204, 205, 206 and 207 are kept in vacuum states independently.

Figure 3A:
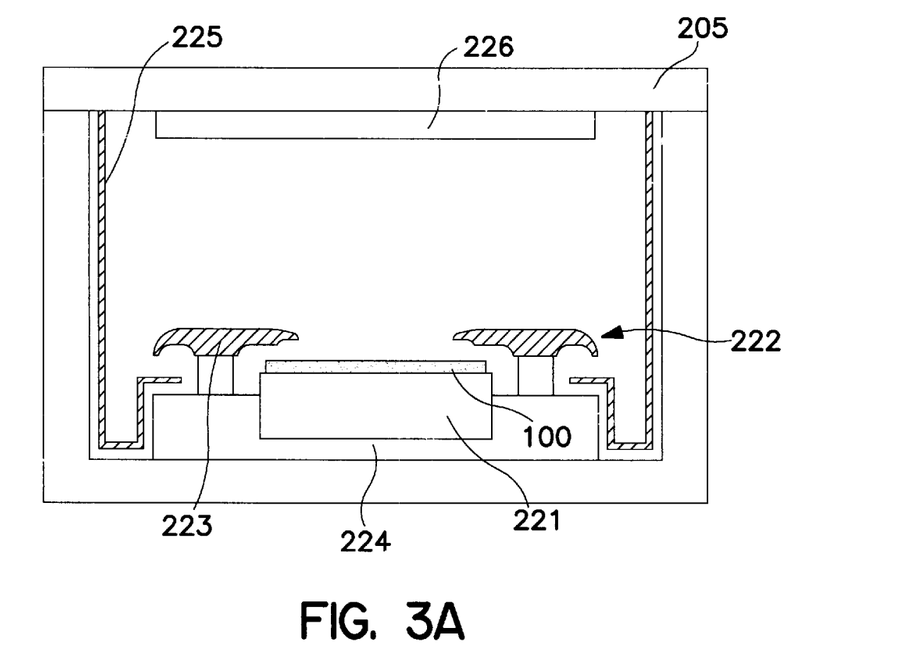
FIG. 3A is a cross sectional elevation view illustrative of a TiN barrier chamber of a deposition system of FIG. 2 before clamping a wafer in accordance with the present invention.
Figure 3B:
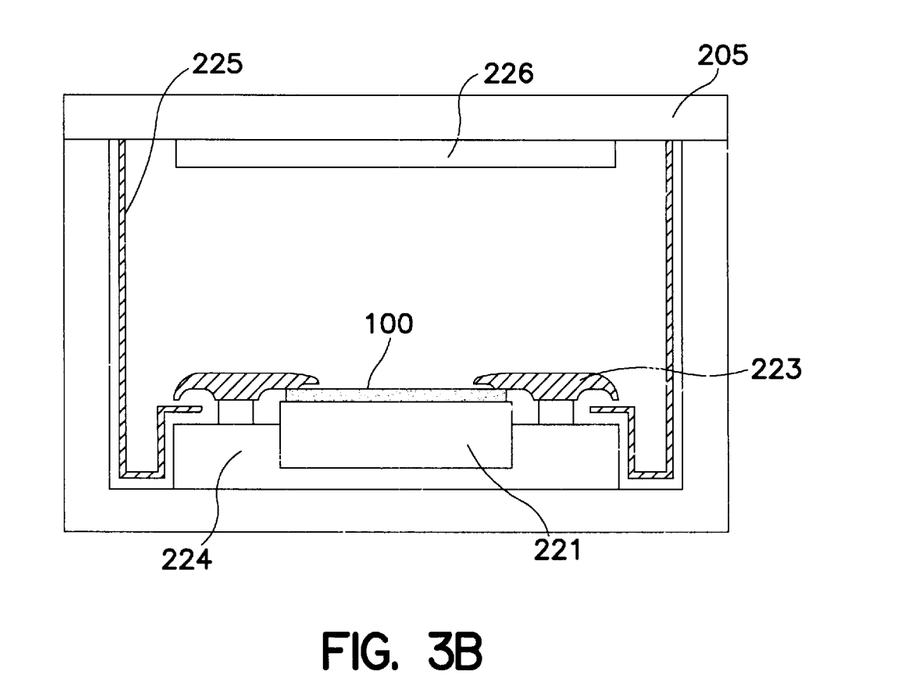
FIG. 3B is a cross sectional elevation view illustrative of a TiN barrier chamber of a deposition system of FIG. 2 after having clamped a wafer for a sputtering process for deposition of a titanium nitride layer in accordance with the present invention.
Figure 4A:
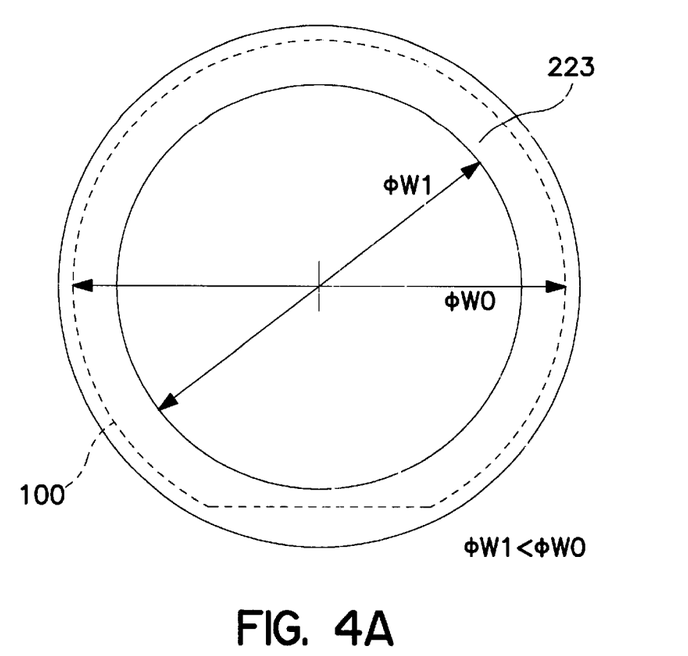
FIG. 4A is a plane view illustrative of a clamp ring of the damper in the TiN barrier chamber in the deposition chamber of FIGS. 3A and 3B in accordance with the present invention.

FIG. 3A is a cross sectional elevation view illustrative of a TiN barrier chamber of a deposition system of FIG. 2 before clamping a wafer. FIG. 3B is a cross sectional elevation view illustrative of a TiN barrier chamber of a deposition system of FIG. 2 after having clamped a wafer for a sputtering process for deposition of a titanium nitride layer. The wafer is mounted on a heat stage 221 accommodated in the TiN barrier chamber 205. A damper 222 is provided around the heat stage for clamping the wafer 100 on the heat stage 221. The damper 222 has a clamp ring 223 and a driver 224 for moving the clamp ring 223 in upward and downward directions for allowing the clamp ring 223 directly clamps or releases the wafer 100. When the driver 224 moves the clamp ring 223 in downward direction so that the clamp ring 223 is made into contact with peripheral portions of the wafer 110 for clamping the wafer 110 on the heat stage 221. A titanium nitride target 226 is provided over the heat stage 221. A shield plate 225 is provided on an inner wall of the TiN barrier chamber 205 for preventing sputtered titanium nitride from being adhered onto the inner walls of the chamber. FIG. 4A is a plane view illustrative of a clamp ring of the damper in the TiN barrier chamber in the deposition chamber of FIGS. 3A and 3B. The clamp ring 223 of the damper 222 of the TiN barrier chamber 205 in the deposition chamber has an inner diameter $\phi$ W1 which is smaller than an outer diameter $\phi$ W0 of the wafer 100.

Figure 4B:
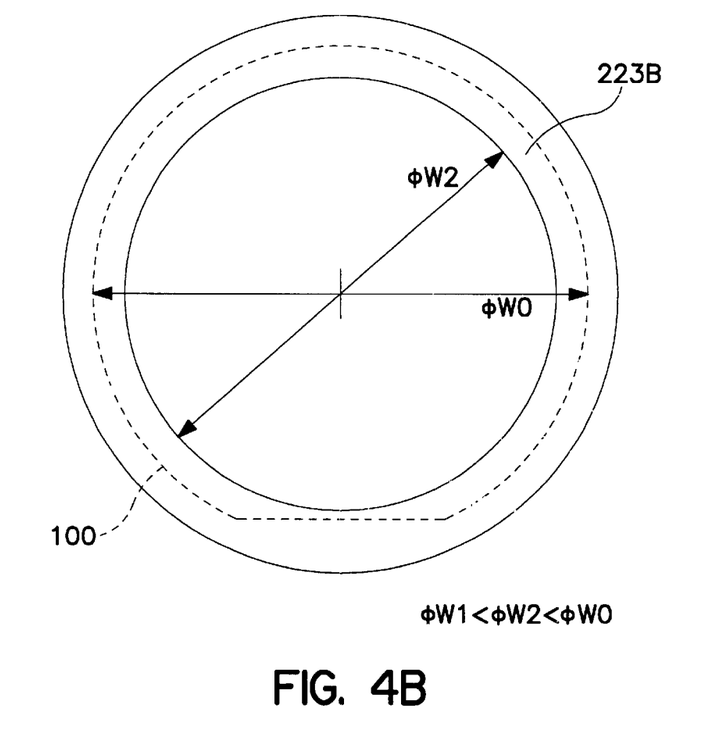
FIG. 4B is a plane view illustrative of a clamp ring of the damper in the copper seed chamber in the deposition chamber of FIGS. 3A and 3B in accordance with the present invention.

The structure of the copper seed chamber 206 is essentially the same as the TiN barrier chamber 205, for which reason illustrations thereof are omitted. The wafer is mounted on a heat stage accommodated in the copper seed chamber 206. A damper is also provided around the heat stage for clamping the wafer on the heat stage. The damper has a clamp ring and a driver for moving the clamp ring in upward and downward directions for allowing the clamp ring directly clamps or releases the wafer. When the driver moves the clamp ring in downward direction so that the clamp ring is made into contact with peripheral portions of the wafer for clamping the wafer 110 on the heat stage. A copper target is provided over the heat stage. A shield plate is also provided on an inner wall of the copper seed chamber 206 for preventing sputtered copper from being adhered onto the inner walls of the chamber. FIG. 4B is a plane view illustrative of a clamp ring of the damper in the copper seed chamber in the deposition chamber of FIGS. 3A and 3B. The clamp ring of the damper of the copper seed chamber in the deposition chamber has an inner diameter $\phi$ W2 which is smaller than an outer diameter $\phi$ W0 of the wafer 100 but larger than the inner diameter $\phi$ W1 of the clamp ring of the clamp chamber 205.

Figure 5A:
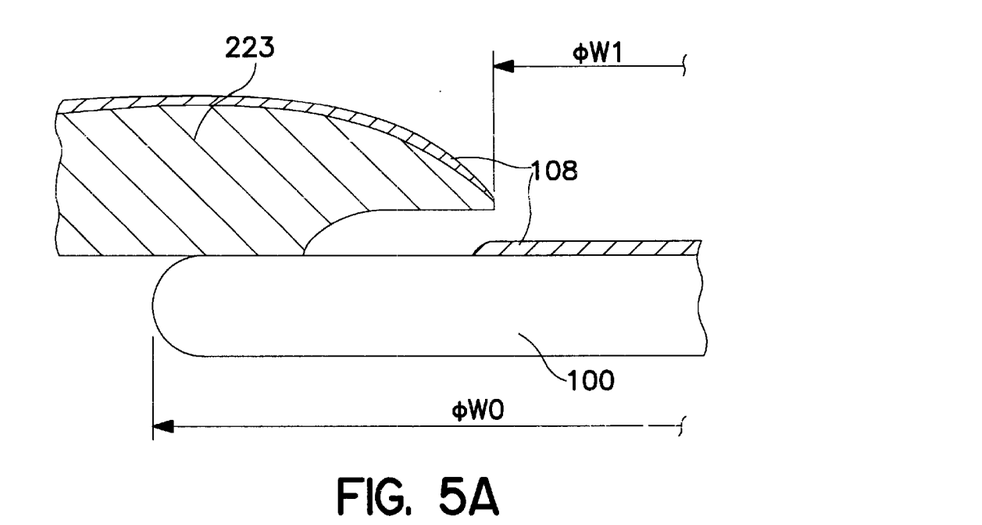
FIG. 5A is a fragmentary cross sectional elevation view illustrative of a deposited TiN barrier layer not only on a wafer but also on a clamp ring after a sputtering process to a wafer in the TiN barrier chamber illustrated in FIG. 3B of the deposition system of FIG. 2 in accordance with the present invention.

Operations of the above deposition chamber 200 will be described. The wafer 100 having set in the first load clock chamber 202 is first carried by the handler 208 into the cleaning chamber 204 for cleaning a surface of the first level interconnection layer by use of a reversed sputtering process utilizing a radio frequency plasma. The wafer 100 is then carried by the handler 208 to the TiN barrier chamber 205. In the TiN barrier chamber 205, the wafer 100 is treated as illustrated in FIGS. 3A and 3B. Namely, the wafer 100 is mounted in the heat stage 221 to be heated up to a temperature of about 25–400° C., and also the clamp ring 223 is moved down to be made into contact with the peripheral portion of the wafer 100 for clamping the wafer 100 onto the heat stage 221, whereby the sputtering process is carried out to deposit the TiN barrier layer 108 as illustrated in FIG. 1C. FIG. 5A is a fragmentary cross sectional elevation view illustrative of a deposited TiN barrier layer not only on a wafer but also on a clamp ring after a sputtering process to a wafer in the TiN barrier chamber illustrated in FIG. 3B of the deposition system of FIG. 2. Since the peripheral portion of the wafer 100 is covered by the clamping ring 223 of the damper 222, the TiN barrier layer is deposited not only on the silicon wafer 100 but also on the clamping ring 223. This means that no TiN barrier layer is deposited on the peripheral region of the wafer 100, and the edge of the TiN barrier layer on the silicon wafer 100 is defined by the edge of the clamping ring 223. The dimension of the peripheral region free of the deposition of the TiN barrier layer 108 is defined by a difference in the inner diameter $\phi$ W1 of the clamping ring 223 of the damper 222 and the outer diameter $\phi$ W0 of the silicon wafer 100.

Figure 5B:
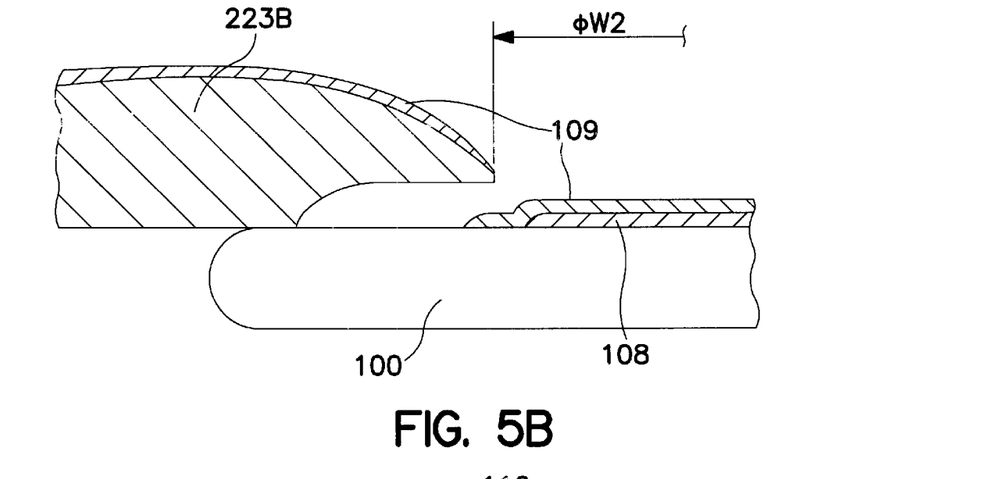
FIG. 5B is a fragmentary cross sectional elevation view illustrative of a deposited copper seed layer not only on a wafer but also on a clamp ring after a sputtering process to a wafer in the copper seed chamber illustrated in FIG. 3B of the deposition system of FIG. 2 in accordance with the present invention.

The wafer 100 formed thereon with the TiN barrier layer 108 is then carried by the handler 208 into the copper seed chamber 206. In the copper seed chamber 206, the wafer 100 is treated so that the wafer 100 is mounted in the heat stage to be heated up to a temperature of about 25° C., and also the clamp ring 223B is moved down to be made into contact with the peripheral portion of the wafer 100 for clamping the wafer 100 onto the heat stage, whereby the copper sputtering process is carried out to deposit the copper seed layer 109 on the TiN barrier layer 108. FIG. 5B is a fragmentary cross sectional elevation view illustrative of a deposited copper seed layer not only on a wafer but also on a clamp ring after a sputtering process to a wafer in the copper seed chamber illustrated in FIG. 3B of the deposition system of FIG. 2. Since the peripheral portion of the wafer 100 is covered by the clamping ring 223B of the damper 222B, the copper seed layer 109 is deposited not only on the TiN barrier layer 108 over the silicon wafer 100 but also on the clamping ring 223B. This means that no copper seed layer is deposited on the peripheral region of the wafer 100, and the edge of the copper seed layer 109 on the silicon wafer 100 is defined by the edge of the clamping ring 223B. The dimension of the peripheral region free of the deposition of the copper seed layer 109 is defined by a difference in the inner diameter $\phi$ W2 of the clamping ring 223B of the damper 222B and the outer diameter $\phi$ W0 of the silicon wafer 100. Since the inner diameter $\phi$ W2 of the clamping ring 223B of the damper 222B in the copper seed chamber 206 is larger than the inner diameter $\phi$ W1 of the clamping ring 223 of the damper 222 in the TiN barrier chamber 205, then the edge of the copper seed layer 109 is positioned outside the edge of the TiN barrier layer 108, whereby the copper seed layer 109 is deposited not only on the TiN barrier layer 108 and the clamping ring 223B of the damper 222B in the copper seed chamber 206 but also on the silicon wafer 100 in an outside region defined between the inner diameter $\phi$ W2 of the clamping ring 223B of the copper seed chamber 206 and the inner diameter $\phi$ W1 of the clamping ring 223 of the TiN barrier chamber 205. Namely, the TiN barrier layer 108 is completely covered by the copper seed layer 109. The dimension of the outside region of the silicon wafer 100 is defined by the difference in the inner diameter $\phi$ W2 of the clamping ring 223B of the copper seed layer 109 and the inner diameter $\phi$ W1 of the clamping ring 223 of the TiN barrier layer 205.

Figure 5C:
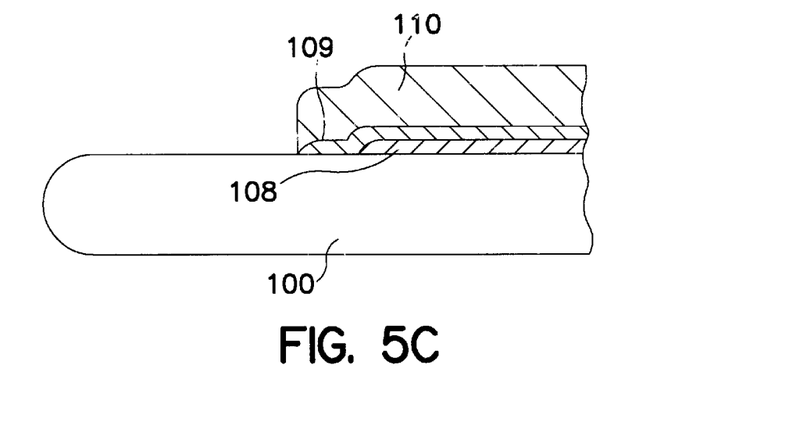
FIG. 5C is a fragmentary cross sectional elevation view illustrative of the silicon wafer formed thereon with the copper plating layer in accordance with the present invention.

The wafer 100 is then carried by the handler 208 to the second load lock chamber 203 as the unloading chamber 203. The wafer 100 is then picked out from the second load lock chamber 203. Thereafter, the copper plating layer 110 is then formed on the copper seed layer 109. FIG. 5C is a fragmentary cross sectional elevation view illustrative of the silicon wafer formed thereon with the copper plating layer. Since the TiN barrier layer 108 is completely covered by the copper seed layer 109, then the copper plating layer 110 is completely separated by the copper seed layer 109 from the TiN barrier layer 108.

The copper plating layer 110, the copper seed layer 109 and the TiN barrier layer 108 are sequentially polished by a chemical and mechanical polishing method so as to leave the copper plating layer 110, the copper seed layer 109 and the TiN barrier layer 108 only with in the second trench groove and the through hole, whereby the copper electrode 111 is then formed in the second trench groove formed in the second inter-layer insulator. The entire parts of the copper plating layer 110 is formed in contact with the surface of the copper seed layer 109, for which reason the copper plating layer 110 is free from the problem with a possibility of peeling from the wafer 100. This means that no problem is raised with drop of the yield due to the peeled part of the copper plating layer. Namely, the present invention allows the improvement in the yield of the semiconductor device.

Figure 6A:
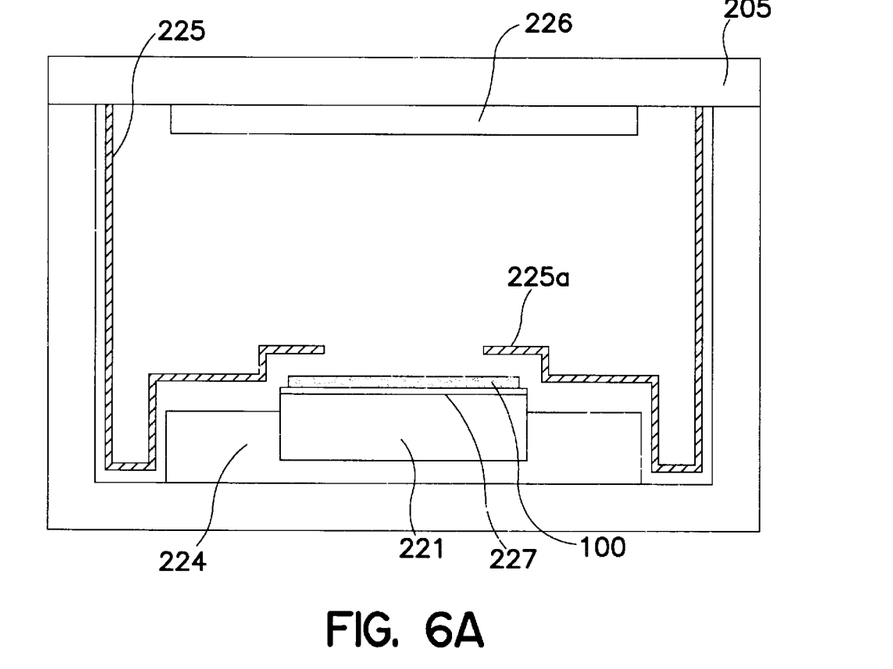
FIG. 6A is a cross sectional elevation view illustrative of another TiN barrier chamber of a deposition system of FIG. 2 before clamping a wafer in accordance with the present invention.
Figure 6B:
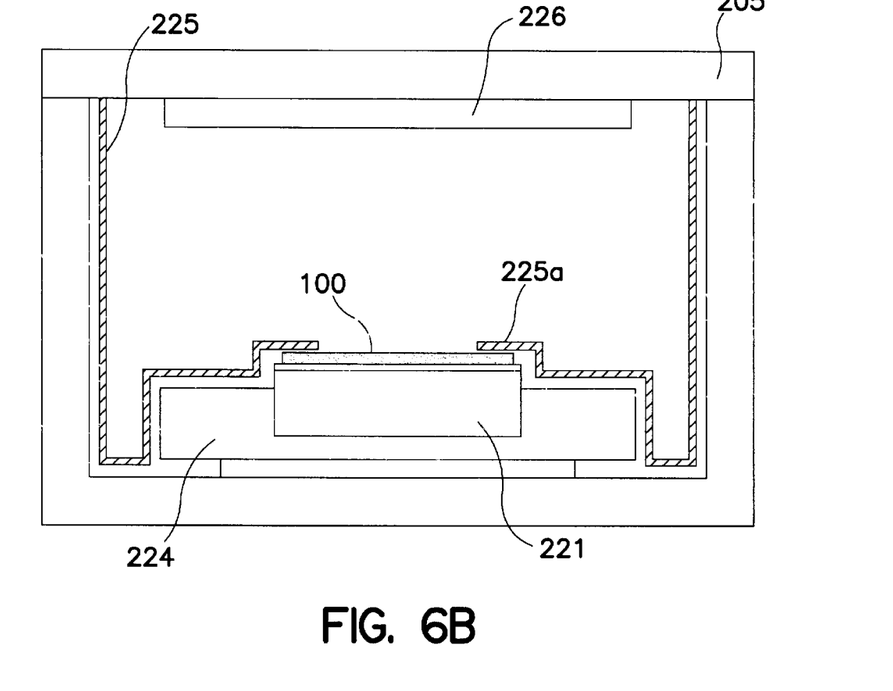
FIG. 6B is a cross sectional elevation view illustrative of another TiN barrier chamber of a deposition system of FIG. 2 after having clamped a wafer for a sputtering process for deposition of a titanium nitride layer in accordance with the present invention.

FIG. 6A is a cross sectional elevation view illustrative of another TiN barrier chamber of a deposition system of FIG. 2 before clamping a wafer. FIG. 6B is a cross sectional elevation view illustrative of another TiN barrier chamber of a deposition system of FIG. 2 after having clamped a wafer for a sputtering process for deposition of a titanium nitride layer. The copper seed chamber may also be structured as of the TiN barrier chamber. The wafer 100 is mounted on a heat stage 221 accommodated in the TiN barrier chamber 205. The wafer 100 is fixed by an electrostatic chuck 227 provided on the heat stage 221. A titanium nitride target 226 is provided over the heat stage 221. A shield plate 225 is provided on an inner wall of the TiN barrier chamber 205 for preventing sputtered titanium nitride from being adhered onto the inner walls of the chamber. No clamper is provided but a sputter mask 225a is provided which extends from the shield plate 225 so that the sputter mask 225a is positioned to cover the peripheral region of the wafer 100, so that no deposition of the TiN barrier layer is made onto the peripheral region of the wafer 100. The heat stage 221 is moved in upward and downward directions by a driver 224. For the sputtering process, the driver 24 moves the heat stage 221 upwardly so that the peripheral region of the wafer 100 is covered by the sputter mask 225a extended from the shield plate 225 to prevent the deposition of the TiN barrier layer on the peripheral region of the wafer 110. The sputter mask 225a is defined by an opening edge thereof which has an inner diameter $\phi$ W1 smaller than the outer diameter $\phi$ W0 of the wafer 100.

The copper seed chamber 206 may also be structured as illustrated in FIGS. 6A and 6B. The wafer 100 is also mounted on a heat stage accommodated in the copper seed chamber 206. The wafer 100 is fixed by an electrostatic chuck provided on the heat stage. A titanium nitride target is provided over the heat stage. A shield plate is provided on an inner wall of the copper seed chamber 206 for preventing sputtered copper from being adhered onto the inner walls of the chamber. No damper is provided but a sputter mask is provided which extends from the shield plate so that the sputter mask is positioned to cover the peripheral region of the wafer 100, so that no deposition of the copper seed layer is made onto the peripheral region of the wafer 100. The heat stage is moved in upward and downward directions by a driver. For the sputtering process, the driver moves the heat stage upwardly so that the peripheral region of the wafer 100 is covered by the sputter mask extended from the shield plate to prevent the deposition of the copper seed layer on the peripheral region of the wafer 110. The sputter mask is defined by an opening edge thereof which has an inner diameter $\phi$ W2 smaller than the outer diameter $\phi$ W0 of the wafer 100 but larger than the inner diameter $\phi$ W1 sputter mask 225a extended from the shield plate 225 in the TiN barrier chamber 205.

Since the peripheral portion of the wafer 100 is covered by the sputter mask extended from the shield plate, the copper seed layer 109 is deposited not only on the TiN barrier layer 108 over the silicon wafer 100 but also on the sputter mask extended from the shield plate. This means that no copper seed layer is deposited on the peripheral region of the wafer 100, and the edge of the copper seed layer 109 on the silicon wafer 100 is defined by the opening edge of the sputter mask extended from the shield plate. The dimension of the peripheral region free of the deposition of the copper seed layer 109 is defined by a difference in the inner diameter $\phi$ W2 of the sputter mask extended from the shield plate and the outer diameter $\phi$ W0 of the silicon wafer 100. Since the inner diameter $\phi$ W2 of the sputter mask extended from the shield plate in the copper seed chamber 206 is larger than the inner diameter $\phi$ W1 of the sputter mask extended from the shield plate in the TiN barrier chamber 205, then the edge of the copper seed layer 109 is positioned outside the edge of the TiN barrier layer 108, whereby the copper seed layer 109 is deposited not only on the TiN barrier layer 108 and the sputter mask extended from the shield plate in the copper seed chamber 206 but also on the silicon wafer 100 in an outside region defined between the inner diameter φ W2 of the sputter mask extended from the shield plate of the copper seed chamber 206 and the inner diameter φ W1 of the sputter mask extended from the shield plate of the TiN barrier chamber 205. Namely, the TiN barrier layer 108 is completely covered by the copper seed layer 109. The dimension of the outside region of the silicon wafer 100 is defined by the difference in the inner diameter φ W2 of the sputter mask extended from the shield plate of the copper seed chamber 206 and the inner diameter φ W1 of the sputter mask extended from the shield plate of the TiN barrier chamber 205.

The wafer 100 is then carried by the handler 208 to the second load lock chamber 203 as the unloading chamber 203. The wafer 100 is then picked out from the second load lock chamber 203. Thereafter, the copper plating layer 110 is then formed on the copper seed layer 109. Since the TiN barrier layer 108 is completely covered by the copper seed layer 109, then the copper plating layer 110 is completely separated by the copper seed layer 109 from the TiN barrier layer 108.

The copper plating layer 110, the copper seed layer 109 and the TiN barrier layer 108 are sequentially polished by a chemical and mechanical polishing method so as to leave the copper plating layer 110, the copper seed layer 109 and the TiN barrier layer 108 only with in the second trench groove and the through hole, whereby the copper electrode 111 is then formed in the second trench groove formed in the second inter-layer insulator. The entire parts of the copper plating layer 110 is formed in contact with the surface of the copper seed layer 109, for which reason the copper plating layer 110 is free from the problem with a possibility of peeling from the wafer 100. This means that no problem is raised with drop of the yield due to the peeled part of the copper plating layer. Namely, the present invention allows the improvement in the yield of the semiconductor device.

In the above embodiment, the buried copper electrode is formed in the trench groove and the through hole which are formed in the second level inter-layer insulator. Notwithstanding, the above present invention is applicable to the other cases, where the copper electrode is formed in at least one of the groove and the through hole of the upper level inter-layer insulator than the second level inter-layer insulator.

The TiN barrier chamber and the copper seed chamber may be provided in separate or different deposition systems.

As a further modification, it is possible that the damper is fixed in position whilst the heat stage is movable in upward and downward directions by the driver so that the wafer is made into contact with the bottom surface of the clamp ring of the damper for masking the peripheral region of the wafer to prevent the deposition of the TiN barrier layer and the copper seed layer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multi-layer structure comprising:
    a barrier layer on a predetermined region of an insulating layer;
    a metal seed layer made of a metal which is different in substance from said barrier layer, said metal seed layer extending not only on an entire surface of said barrier layer but also a peripheral region positioned outside said predetermined region of said insulating layer; and
    a metal plating layer made of the same metal as said seed layer, and said metal layer being adhered on said metal seed layer so that said metal plating layer is separated from said barrier layer and also from said insulating layer.

2. The multi-layer structure as claimed in claim 1, wherein said barrier layer comprises a TiN barrier layer, and said metal seed layer and said metal plating layer are made of copper.

3. The multi-layer structure as claimed in claim 1, wherein said multi-layer structure is formed in at least one of a trench groove in an inter-layer insulator as said insulating layer and a through hole also formed in said inter-layer insulator.

4. A multi-layer structure comprising:
    a barrier layer formed on a predetermined region of an insulating layer;
    a metal seed layer made of a metal which is different in substance from said barrier layer, said metal seed layer formed on, and completely encompassing said barrier layer and also a peripheral region positioned outside said predetermined region of said insulating layer; and
    a metal plating layer made of the same metal as said seed layer, and said metal layer being adhered on said metal seed layer so that said metal plating layer is separated from said barrier layer and also from said insulating layer.

5. The multi-layer structure as claimed in claim 4, wherein said barrier layer comprises a TiN barrier layer, and said metal seed layer and said metal plating layer are made of copper.

6. The multi-layer structure as claimed in claim 4, wherein said multi-layer structure is formed in at least one of a trench groove in an inter-layer insulator as said insulating layer and a through hole also formed in said inter-layer insulator.

* * * * *